United States Patent
Zhang et al.

(10) Patent No.: US 11,500,725 B2
(45) Date of Patent: Nov. 15, 2022

(54) METHODS FOR DATA RECOVERY OF A DISTRIBUTED STORAGE SYSTEM AND STORAGE MEDIUM THEREOF

(71) Applicant: HERE DATA TECHNOLOGY, Guangdong (CN)

(72) Inventors: Jingyao Zhang, Guangdong (CN); Jian Zhu, Guangdong (CN); Bin Hao, Guangdong (CN)

(73) Assignee: HERE DATA TECHNOLOGY, Shenzhen (CN)

( * ) Notice: Subject to any disclaimer, the term of this patent is extended or adjusted under 35 U.S.C. 154(b) by 58 days.

(21) Appl. No.: 16/973,029

(22) PCT Filed: Jul. 10, 2018

(86) PCT No.: PCT/CN2018/095084
§ 371 (c)(1),
(2) Date: Dec. 7, 2020

(87) PCT Pub. No.: WO2020/010504
PCT Pub. Date: Jan. 16, 2020

(65) Prior Publication Data
US 2021/0271552 A1    Sep. 2, 2021

(51) Int. Cl.
*G06F 17/16* (2006.01)
*H03M 13/37* (2006.01)
*G06F 11/10* (2006.01)
*G06F 11/07* (2006.01)
*G06F 11/30* (2006.01)
*H03M 13/00* (2006.01)
*G06F 3/06* (2006.01)

(52) U.S. Cl.
CPC ...... *G06F 11/1088* (2013.01); *G06F 11/0793* (2013.01); *G06F 11/3034* (2013.01); *G06F 17/16* (2013.01); *H03M 13/373* (2013.01); *H03M 13/616* (2013.01); *G06F 3/065* (2013.01); *G06F 3/067* (2013.01); *G06F 3/0619* (2013.01)

(58) Field of Classification Search
None
See application file for complete search history.

(56) References Cited

U.S. PATENT DOCUMENTS 10,146,618 B2 * 12/2018 Pamies-Juarez ...... G06F 3/0619
11,188,404 B2 * 11/2021 Zhang ................. G06F 11/1469

* cited by examiner

*Primary Examiner* — Cynthia Britt
*Assistant Examiner* — Matthew W Wahlin

(57) ABSTRACT

A method of data recovery for a distributed storage system is a method of recovering multiple failed nodes concurrently with the minimum feasible bandwidth when failed nodes exist in a distributed storage system. By means of selecting assistant nodes, obtaining helper data sub-blocks through computing the selected assistant nodes, then computing a repair matrix and finally multiple the repair matrix and the helper data sub-blocks, the missing data blocks are reconstructed; or the missing data blocks are reconstructed by decoding. The method is applicable to data recovery in the case of any number of failed nodes and any reasonable combinations of coding parameters. The data recovery herein can reach the theoretical lower limit of the minimum recovery bandwidth.

6 Claims, 6 Drawing Sheets

METHODS FOR DATA RECOVERY OF A DISTRIBUTED STORAGE SYSTEM AND STORAGE MEDIUM THEREOF

TECHNICAL FIELD

The present disclosure relates to the field of distributed storage, and in particularly, to data recovery for minimum storage regenerating code via product matrix construction.

BACKGROUND

With the rapid development of emerging technologies such as the Internet, big data and cloud computing in recent years, the demand for massive data storage has also proliferated; accordingly, distributed data storage systems are becoming the main stream for massive data storage. Distributed storage systems outperform single-node storage systems in the respects of high reliability, high availability and high scalability. In a distributed storage system, it is common that one or more nodes fail. Under such condition, the service of the entire system can be kept uninterrupted through redundancy techniques such as replication or erasure coding. Erasure coding has larger space efficiency than simple replication, hence it is widely adopted in industry like the distributed storage systems from Microsoft, Azure and OceanStore. Specially, maximum distance separable (MDS) erasure codes are preferred since they can maximize the storage efficiency.

When node failure happens, the distributed storage system should recover the lost data in time to maintain redundancy and avoid longtime "degraded reading" which means reading a plurality of non-original data segments and then calculating required data in one way or another. This is usually accomplished through replacing or repairing the failed node(s) and recovering data on the new node(s) i.e. the substitute node(s). Since initially the substitute node knows nothing about the lost data, it has to get "helper data" from the other non-failed node(s) i.e. surviving node(s) which is called "assistant node(s)". In a busy storage system, the network bandwidth cost by downloading the helper data for data recovery, referred to as "recovery bandwidth" is crucial to the performance of the overall system. Therefore, it is necessary to consider and discuss the minimization of the recovery bandwidth when designing and optimizing a distributed storage system. Benefiting from the idea of network coding, regenerating code can minimize the recovery bandwidth for node failure. And among them, minimum storage regenerating (MSR) code is a very useful class of regenerating code, since it can maximize the storage efficiency, meanwhile minimizing the recovery bandwidth.

MSR code constructed via product matrix (PM) is an important type of MSR codes with a simple and ingenious arrangement. Unfortunately, original PM MSR code only addresses the data recovery for a single node failure. However, practical distributed storage systems prevalent to suffer from multiple node failures that happen concurrently. One solution is to recover the failed nodes one by one like the way to handle the single node failure, which is straightforward but wasteful in bandwidth resource. Another way is to repair the failed nodes jointly to minimize the total required bandwidth. Another advantage of concurrent recovery over single recovery is that the repairing can be deferred until the number of failed nodes reaches a threshold or the degraded reading has lasted for certain time, hence the overall repairing cost can be further reduced.

Some current research works have considered this problem from various aspects, and a method that can concurrent recovery a general number of failed nodes through the concept of "virtual symbols" proposed, which has also proved the lower bound of the bandwidth of concurrent recovery. But the method evolves solving complex equations, which is huge and difficult to implement. Besides, a proxy-assisted MSR code with which the assistant node does not need to encode the helper data before transmission was studied and the existence of such codes for single- and double-node failures were proved. However, the solution of concurrent recovery for any number of failed nodes and general coding parameters is still not proposed.

Another category of concurrent recovery strategies for multiple data blocks adopts cooperation between nodes, wherein substitute nodes first download helper data from surviving nodes and then exchange the information they have with each other. Through careful design of coding structure, the recovery bandwidth can be reduced or even achieve a theoretical lower bound. Although cooperative recovery can minimize the recovery bandwidth in theory, it will meet difficulties in practice. Such two-phase data exchange i.e. "first-download-then-exchange" increases the completion time and requires more overhead, thereby requiring complex protocols to control, which leads to error prone.

From practical point of view, the policies of data recovery can be divided into two classes: centralized and distributed. With the centralized policy, an agent may collect helper data, then reconstruct the lost data and finally upload the recovered data to the actual substitute nodes. Conversely, with the distributed policy, substitute nodes collect and reconstruct data by themselves without the help of the agency. There are also mixtures of both policies, like cooperative recovery mentioned above, but the complexity of its implementation is high. Most previous works fall into the centralized category, and only consider the bandwidth of collection of helper data. But actually the uploading of reconstructed data to also substitute nodes consumes bandwidth, which fails to be considered in the previous works. The impact of network topology on recovery bandwidth and recovery strategies was investigated by some research, however, only some simple network topologies including tandem, star and grid networks have numerical results.

In addition, current data recovery strategies all use as many assistant nodes as possible when reconstructing data so as to reduce recovery bandwidth. It has been proved in theory that when all normal nodes except failed nodes, say, when all "surviving node" participate the data recovery as assistant nodes, the bandwidth is minimized. However in practical systems, more evolved assistant nodes will mean more delay and overhead, hence it is not always optimal to bother more assistant nodes in the case of comprehensive consideration of various aspects of performance.

SUMMARY

A method of data recovery for a distributed storage system with minimum storage regenerating code constructed via product matrix construction is proposed to solve a technical problem that is to provide a data recovery method for a distributed storage system which can be used for concurrent recovery of multiple failed nodes in the distributed storage system.

A method of data recovery for a distributed storage system is used for data recovery of a failed node in the distributed storage system, and the distributed storage system adopts a decoding method of the distributed storage system. Two methods of data recovery with MSR code constructed via PM (PM MSR) are provided herein, including centralized and distributed modes. In the centralized mode of data recovery, the number of the assistant nodes is chosen according to the number of the failed nodes to be recovered and the collection of the helper data sub-blocks, the computation of the repair matrix and the reconstruction of the missing data are implemented by a central agent. In the distributed mode of data recovery, the number of the assistant nodes is chosen according to the number of the failed nodes to be recovered, each new node reconstructs the data blocks stored on the failed node that it substitutes, and the collection of the helper data sub-blocks, the computation of the repair matrix and the reconstruction of the missing data are implemented by each corresponding new node.

The data recovery method comprises the following steps:

Step 1: selecting assistant nodes from surviving nodes, calculating helper data sub-blocks by using the assistant nodes, and sending the helper data sub-blocks to a regenerating node, that is a node for data regenerating, the number of the selected assistant nodes being related to the number of the failed nodes to be recovered;

Step 2: calculating a repair matrix based on the PM MSR code and the missing data information; and Step 3: obtaining the missing data blocks by multiplying the repair matrix with the helper data sub-blocks to implement the reconstruction of data blocks.

In the actual operation process, to obtain the repair matrix, it is necessary to add node information that does not include the missing block to the loss list, or replace the node information in the original loss list with the node information that does not include the missing block. For example, in distributed mode, a new node can not only reconstruct the data blocks stored on the failed node that it substitutes, but also the data blocks required by other new nodes. In this respect, the new node can choose to send the extra reconstructed data blocks to other new nodes as needed, so as to prevent the new nodes from reconstructing the data blocks by themselves. This can further reduce the recovery bandwidth and computing overhead.

The beneficial effect of the present disclosure is that by providing a method of data recovery for a distributed storage system with MSR code constructed via PM, one or more data blocks can be reconstructed at the same time, which overcomes the difficulty that the lower limit of the minimum recovery bandwidth theory is difficult to achieve, and does not require data exchange between the new nodes, and the data can be repaired under any number of failed nodes and reasonable encoding parameters.

DETAILED DESCRIPTION

The present disclosure will be further described in detail below through specific embodiments in combination with the accompanying drawings. Many details described in the following embodiments are for the purpose of better understanding the present disclosure. However, a person skilled in the art can realize with minimal effort that some of these features can be omitted in different cases or be replaced by other methods. For clarity some operations related to the present disclosure are not shown or illustrated herein so as to prevent the core from being overwhelmed by excessive descriptions. For the person skilled in the art, such operations are not necessary to be explained in detail, and they can fully understand the related operations according to the description in the specification and the general technical knowledge in the field.

In addition, the features, operations or characteristics described in the specification may be combined in any suitable manner to form various embodiments. At the same time, the steps or actions in the described method can also be sequentially changed or adjusted in a manner that can be apparent to those skilled in the art. Therefore, the various sequences in the specification and the drawings are only for the purpose of describing a particular embodiment, and are not intended to be an order of necessity, unless otherwise stated one of the sequences must be followed.

In an embodiment of the present disclosure, a method of data recovery for a distributed storage system with MSR code constructed via PM (PM MSR) is proposed. The basic thinking of this method is to construct a repair matrix that is applicable to any number of failed nodes and any valid combination of coding parameters, and the lost data can be obtained by simply multiplying the helper data with the repair matrix.

Figure 2:
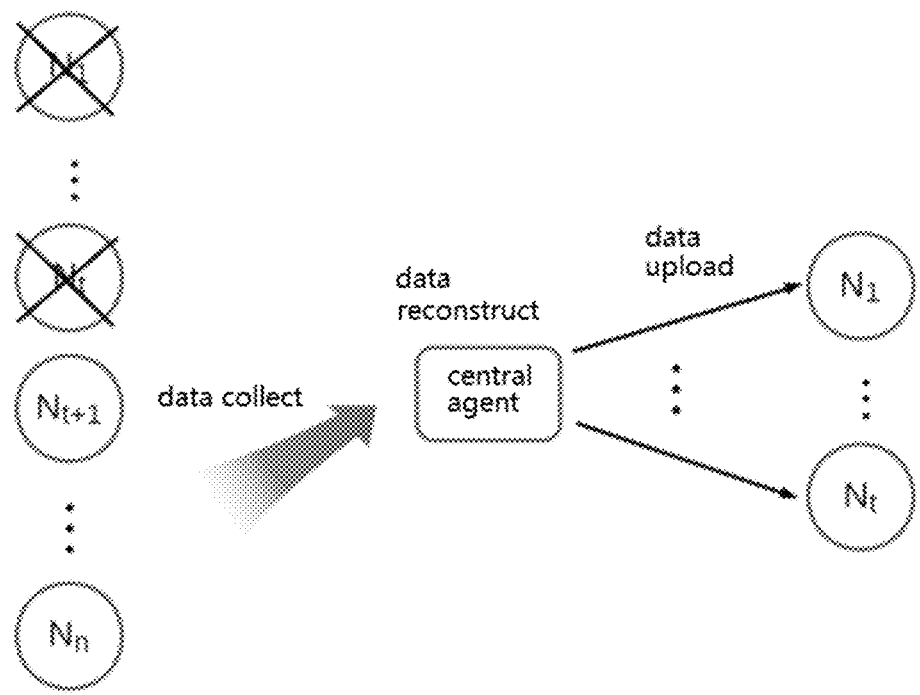
FIG. 2 is a system model diagram schematically shown data recovery in a centralized recovery mode.
Figure 3:
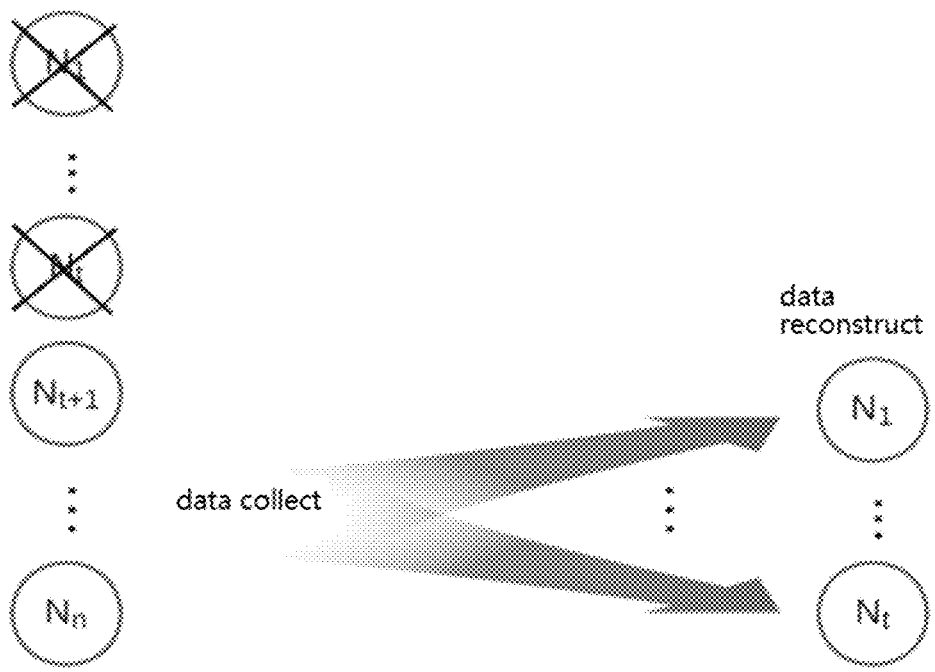
FIG. 3 is a system model diagram schematically shown data recovery in a distributed recovery mode.

Separate data recovery algorithms for PM MSR codes are further proposed for centralized and distributed modes in the embodiments of the present disclosure. FIG. 2 and FIG. 3 depict the system models of concurrent failure recovery in centralized and distributed modes, respectively. In a distributed storage system, there are totally n storage nodes (denoted by $N_1, N_2, \ldots, N_n$), and t nodes out of them fail. As shown in FIG. 2 and FIG. 3, it assumes the first t nodes $N_1, N_2, \ldots, N_n$ fail in without loss of generality. In the centralized recovery mode, a central agent collects helper data and regenerates the lost data, then sends the recovered data to the t new nodes. While in the distributed recovery mode, t new nodes handle the collection of helper data and the regeneration of the lost data by themselves independently of each other, and each new node needs only to reconstruct the lost data on the failed node that it substitutes, that is the new nodes herein are also referred to as substitute nodes.

For convenience, the notions that are used throughout this disclosure and their definitions will be first presented. A minimum storage regenerating code via product matrix construction (PM MSR) is denoted by C(n,k,d), where n is the total number of nodes, k is the number of "systematical nodes" on which the uncoded original data blocks are stored; thus m=n−k is the number of "parity nodes" which hold the encoded data blocks. d is "repair degree" which is defined to be the number of assistant node required for the recovery when there is only one failed node.

Given that the total amount of data to be stored is B. With the requirement of PM MSR code, data of amount B is divided into k segments of the same size, and then encoded into n data blocks denoted by $b_1, b_2, \ldots, b_n$ with block ID 1, 2, ..., n respectively. Each data blocks $b_i$ consists of $\alpha$ sub-blocks $s_{i1}, s_{i2}, \ldots, s_{i\alpha}$. According to the relevant theory of MSR code, there are two equations as follows:

$$\alpha = d - k + 1 \quad (1)$$

and $$B = k\alpha = k(d-k+1) \quad (2)$$

PM MSR code requires that $d \geq 2k-2$, thus $n \geq d+1 \geq 2k-1$ and $\alpha \geq k-1$.

To this general case, the data amount B will be encoded to n' data blocks based on the extended PM MSR code C(n',k',d'), where $n'=n+\delta$, $k'=k+\delta$ and $d'=d+\delta$. $\delta$ denotes the number of virtual nodes added by the extension, and it is chosen to make $d'=2k'-2$, then:

$$\delta = d - (2k-2) \quad (3)$$

and $$d' = 2(k+\delta) - 2 = 2(d-k+1) = 2\alpha \quad (4)$$

PM MSR code is constructed through the following formula:

$$C = \Psi M \quad (5)$$

where M is the $d' \times \alpha$ message matrix with $$M = \begin{bmatrix} s_1 \\ s_2 \end{bmatrix} \quad (6)$$

where $S_1$ and $S_2$ are $\alpha \times \alpha$ symmetric matrices constructed such that the $(\alpha+1)\alpha/2$ entries in the upper-triangle of each matrix are filled by distinct data sub-blocks. $\Psi = [\Phi \Lambda \Phi]$ is the $n' \times d'$ encoding matrix, and the ith row of $\Phi$ is denoted by $\phi_i$. $\Lambda$ is an $n' \times n'$ diagonal matrix as $$\Lambda = \begin{bmatrix} \lambda_1 & & & \\ & \lambda_2 & & \\ & & \ddots & \\ & & & \lambda_{n'} \end{bmatrix} \quad (7)$$

C is the resulted $n' \times \alpha$ coded matrix, each entry thereof is a data sub-block after encoded, and the ith row of C is:

$$c_i = \varphi_i M = [\phi_i \lambda_i \phi_i] M = \phi_i S_1 + \lambda_i \phi_i S_2 \quad (8)$$

where $\varphi_i = [\phi_i \lambda_i \phi_i]$ is the ith row of $\Psi$. M is encoded in such a way that the resulted C is systematical, that means, the first $\delta$ rows of C are all zero, and rows $\delta+1$ to $\delta+k$ are exactly the source data, while the last $m=n'-k'$ rows are coded parity data. The advantage to this is that the source data can be read without decoding where there is no failed systematical node. It should be noted that all the matrices and data mentioned in this embodiment are represented by entries of finite field GF(q).

Before recovery, $\delta$ virtual nodes on which the data are all zero are firstly added to the system when a node fails. Let $\{N_i | 1 \leq i \leq n'\}$ denote the set of both virtual nodes and real nodes, where $N_1 \sim N_\delta$ are virtual nodes and $N_{\delta+1} \sim N_{n'}$ are real nodes. Hence it can be viewed that $\{c_i | 1 \leq i \leq n'\}$ are held by n' nodes. Note that, the "node" used herein can be either physical or logical, say, multiple logical nodes can reside on one or more physical machines, which does not affect the effectiveness of the present disclosure. For another, the virtual nodes mentioned herein are not real and are conceived for theoretical reasoning, reflecting the thinking process of the inventor and easy understanding by those skilled in the art.

The number of failed nodes is denoted by $t \geq 1$. The set of the indices of all missing blocks $X = \{x_i | i=1, \ldots, t, \delta < x_i \leq n'\}$ is defined as a loss list. The missing blocks are denoted by $c_{x_1}, c_{x_2}, \ldots, c_{x_t}$. Without loss of generality, it is assumed that $x_i$ in x are in ascending order. Currently there are n'−t surviving nodes including virtual nodes, and d'−t+1 nodes are chosen from them as assistant nodes to help recover the lost data. The set of the assistant nodes is denoted by $N_a = \{N_{a_i} | 1 \leq i \leq d'-t+1, 1 \leq a_i \leq n', a_i \notin X\}$. Both assistant nodes and failed nodes are called "evolved nodes", represented by $$N_e = \{N_j | N_j \in N_a \text{ or } j \in X\} \quad (9)$$

It can be seen that there are d'+1 members in the union set $N_e$.

During recovery, each assistant node $N_j \in N_a$ first calculates the inner products between its data block $c_j$ (regarded as a vector composed of sub-blocks $[c_{j1}, c_{j2}, \ldots, c_{j\alpha}]$) and $\{\phi_{x_i} | i=1, \ldots, t\}$, resulting in t encoded sub-blocks:

$$\{h_{x_i,j} = c_j \phi_{x_i}^t | i=1, \ldots, t\} \quad (10)$$

Then the encoded sub-blocks are sent to the regenerating node as helper data. Thus the regenerating node will get t(d't+1) helper sub-blocks in total. Note that, the premise of selecting d'−t+1 nodes as assistant nodes from surviving nodes mentioned above is to concurrently repair t failed nodes; however the nodes to be modified can also be selected according to actual conditions, in this way, the number of the selected assistant nodes will change, which will be further described below when discussing the centralized and distributed recovery modes.

The regenerating node recovers the missing data blocks through "repair matrix" which is obtained as follows.

First, for each $x_i, x_j \in X, j \neq i$, according to the following formula (11), calculating a matrix $$\Omega_{i,j} = \theta_{x_i,f_j^i} \phi_{x_i} \quad (11)$$

where $$\theta_{x_i,f_j^i} = \overline{\psi_{x_i,f_j^i}^{-1}} + \lambda_{x_i} \underline{\psi_{x_i,f_j^i}^{-1}} \quad (12)$$

and $\overline{\psi_{x_i,f_j^i}^{-1}}$ is a vector consisting of the upper $\alpha$ entries of $\psi_{x_i,f_j^i}^{-1}$, i.e. the front part of $\psi_{x_i,f_j^i}^{-1}$, while $\underline{\psi_{x_i,f_j^i}^{-1}}$ is the lower a entries of $\psi_{x_i,f_j^i}^{-1}$, i.e. the rear part of $\psi_{x_i,f_j^i}^{-1}$. Here $\psi_{x_i,f_j^i}^{-1}$ denotes the column of the matrix $\Psi_{x_i}^{-1}$ that corresponds to helper data sub-blocks $h_{x_i,x_j} = c_{x_j} \phi_{x_i}^t$. $\Psi_{x_i}^{-1}$ is the inverse matrix of the matrix shown in the following formula (13):

$$\Psi_{x_i} = [\psi_j^t | N_j \in N_e, j \neq x_i]^t \quad (13)$$

that is, $\Psi_{x_i}$ in the formula (13) is the submatrix composed of the rows corresponding to the evolved nodes except $N_{x_i}$, say, $\Psi_{x_i}$ is the remainder of matrix $\Psi$ in which the rows associated with nodes $N_{x_i}$ has been removed. $f_j^i$ is the index of the column in the matrix $\Psi_{x_i}^{-1}$ that corresponds to the helper data sub-blocks $h_{x_i,x_j} = c_{x_j} \phi_{x_i}^t$. The computation of each matrix mentioned above is shown as that of the submatrix on the left side of FIG. 4.

Figure 5:
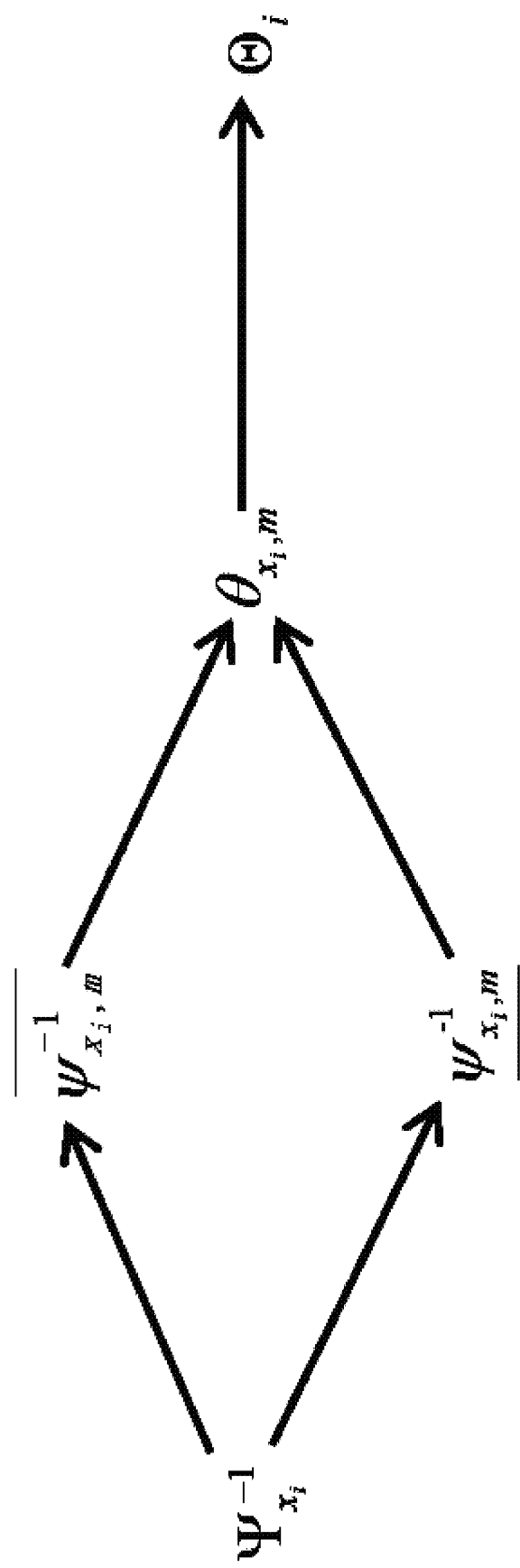
FIG. 5 is a diagram showing the calculation of the right sub-matrix of a repair matrix.

Next, let $X_i = X | x_i$ to be the ordered set of the remaining indices of the loss list X without $x_i$, and $G_i = \{g_j^i | j \neq i\}$ to be the ordered set of indices of columns in $\Psi_{x_i}^{-1}$ that corresponds to the data block $\{c_{x_j} | x_j \in X_i\}$. For each i=1~t, calculating according to the following formula (14)

$$\Theta_i = [\theta_{x_i,m} | 1 \leq m \leq d', m \notin G_i] \quad (14)$$

where the computation of $\theta_{x_i,m}$ is the same as the formula (12), and the specific process is as shown in the calculation process of the submatrix on the right side of FIG. 5.

Combining the computation mentioned above, we have $$\begin{bmatrix} I & \Omega_{1,2} & \cdots & \Omega_{1,t} \\ \Omega_{2,1} & I & \cdots & \Omega_{2,t} \\ \vdots & \cdots & \ddots & \vdots \\ \Omega_{t,1} & \Omega_{t,2} & \cdots & I \end{bmatrix} \begin{bmatrix} c_{x_1} \\ c_{x_2} \\ \vdots \\ c_{x_t} \end{bmatrix} = \begin{bmatrix} \Theta_1 \vec{h}_{x_1} \\ \Theta_2 \vec{h}_{x_2} \\ \vdots \\ \Theta_t \vec{h}_{x_t} \end{bmatrix} \quad (15)$$

where $$\vec{h}_{x_i} = [h_{x_i,j} = c_j \phi_{x_i}^t \mid j \in N_a]^t \quad (16)$$

are a vector which consists of coded sub-blocks calculated by each assistant node through making the inner product between the data blocks it have and $\phi_{x_i}$.

For each $x_i$, the size of the vector $\vec{h}_{x_i}$ is d'−t+1. But actually the first $\delta$ entries of $\vec{h}_{x_i}$ are all zero (provided by the virtual nodes), hence the first $\delta$ columns of each $\Sigma_i$ are not useful at all. Therefore, the matrix on the right side of the formula (15) can be streamlined by replacing each $\Theta_i \vec{h}_{x_i}$ $\Theta_i'$ $\vec{h}_{x_i}'$, where $\Theta_i'$ is $\Theta_i$ without the first $\delta$ columns and $\vec{h}_{x_i}'$ is $\vec{h}_{x_i}$ without the first $\delta$ entries.

Let $$\Xi_X = \begin{bmatrix} I & \Omega_{1,2} & \cdots & \Omega_{1,t} \\ \Omega_{2,1} & I & \cdots & \Omega_{2,t} \\ \vdots & \cdots & \ddots & \vdots \\ \Omega_{t,1} & \Omega_{t,2} & \cdots & I \end{bmatrix} \quad (17)$$

If the matrix $\Xi_X$ is invertible, the repair matrix can be obtained by the following formula as follows:

$$R_X = \begin{bmatrix} I & \Omega_{1,2} & \cdots & \Omega_{1,t} \\ \Omega_{2,1} & I & \cdots & \Omega_{2,t} \\ \vdots & \cdots & \ddots & \vdots \\ \Omega_{t,1} & \Omega_{t,2} & \cdots & I \end{bmatrix}^{-1} \begin{bmatrix} \Theta_1' & & & \\ & \Theta_2' & & \\ & & \ddots & \\ & & & \Theta_t' \end{bmatrix} \quad (18)$$

After the repair matrix is computed, the missing data blocks can be reconstructed by left multiplying the vector $[\vec{h}_{x_1}'^t, \vec{h}_{x_2}'^t, \ldots, \vec{h}_{x_t}'^t]^t$ composed of the helper data sub-blocks with $R_X$.

The repair matrix in the formula (18) works for any t<min{k,α}. For t≥min{k,α}, decoding can be used for recovery, that is, choosing k nodes as the assistant nodes randomly from the surviving node, downloading k×α data sub-blocks from all the k assistant nodes, then decoding these data sub-blocks to get the source data and finally encoding the source data into the lost data blocks. But if t>m, the lost data are not recoverable since the current number of surviving nodes is n−t<k derived from m=n−k.

Besides, if the matrix $\Xi_x$ is not invertible, the repair matrix cannot be calculated through the formula (18). Several solutions can handle this situation, including but not limiting to: 1) adding one or several nodes to X to make $\Xi_x$ invertible; 2) replacing one or some nodes in X with other nodes to make $\Xi_x$ invertible; and 3) decoding to implement data reconstruction. Since the possibility of such situation is rather small, any solutions have marginal effect on the overall performance. When adopting the solution of 1) and/or 2), the actual repair data block not only includes real lost data blocks, but also the data blocks on the new added or replaced nodes.

Figure 1:
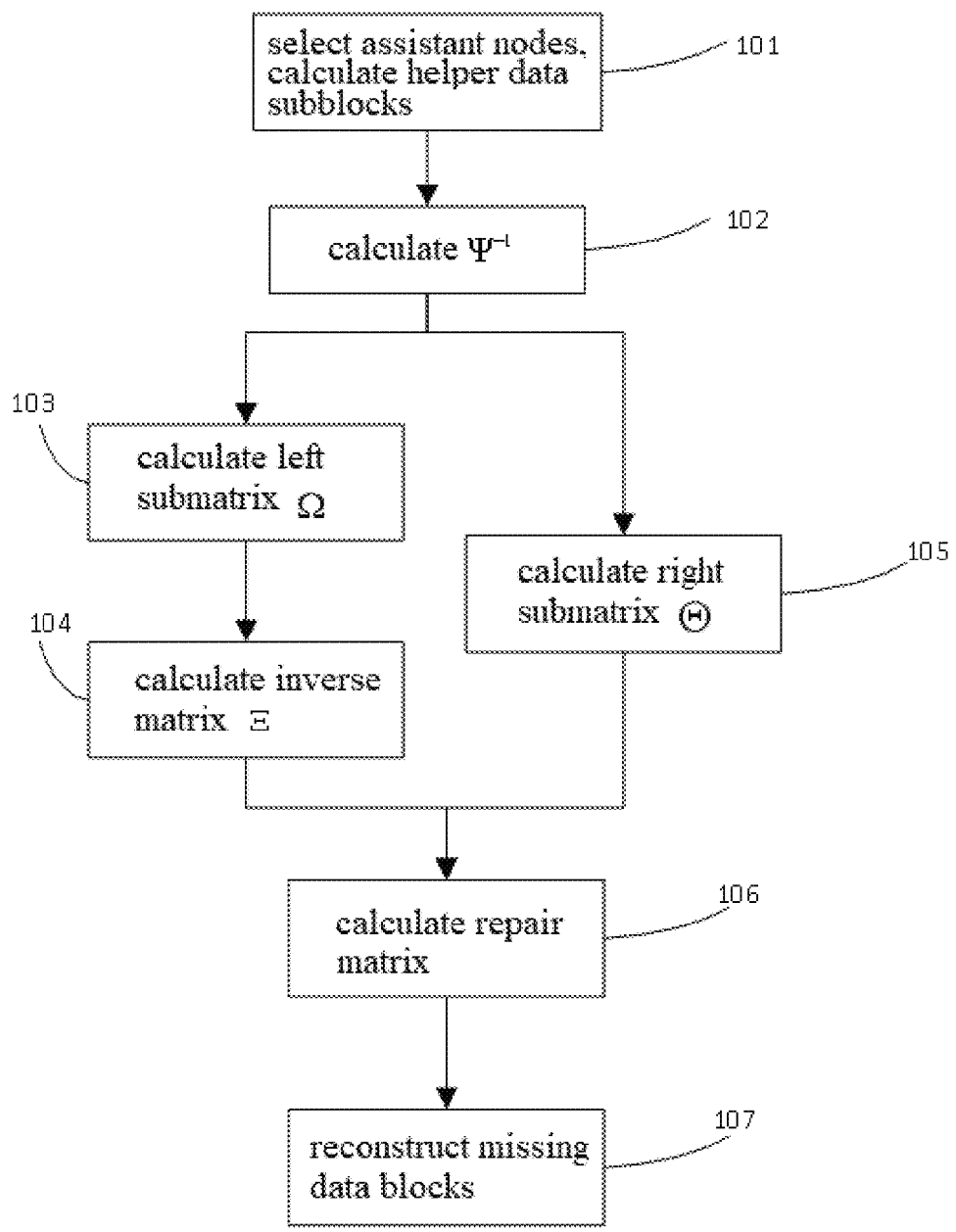
FIG. 1 is a flowchart of the computation of recovery for data blocks.
Figure 4:
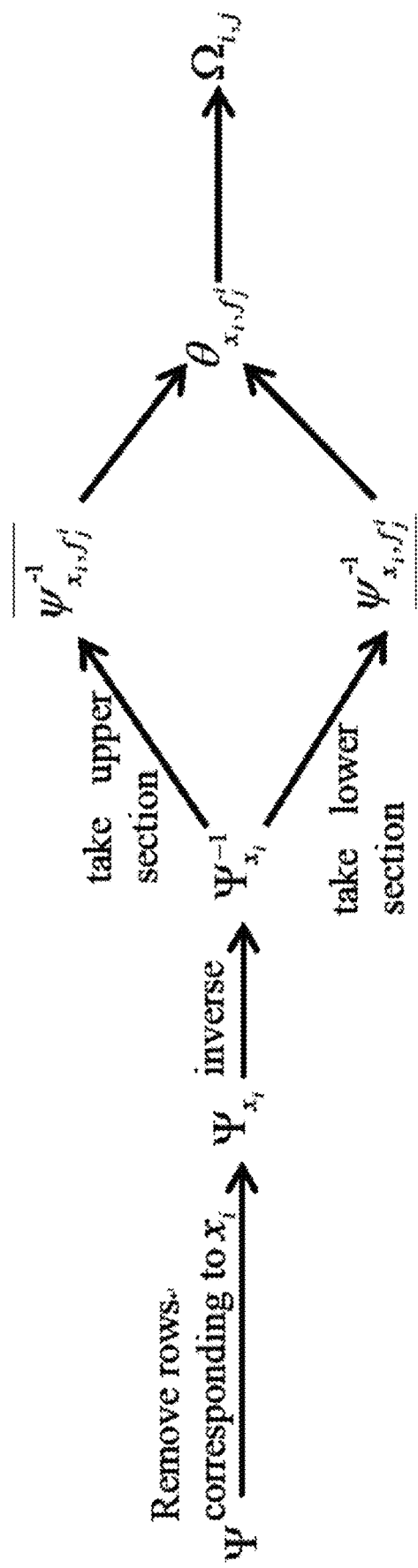
FIG. 4 is a diagram showing the calculation of the left sub-matrix of a repair matrix.

The computation of the repair matrix is summarized as step 102 to step 106 shown in FIG. 1. The detailed procedure on each step in the figure is as follows:

Step 1: for each $x_i \in X$, computing $\Psi_{x_i}^{-1}$ according to the formulas (9) and (13);

Step 2: for each $x_i, x_j \in X$, j≠i, computing $\Omega_{i,j}$ according to FIG. 4 an the formula (11);

Step 3: based on the result in Step 2, constructing $\Xi_X$ according to the formula (17);

Step 4: for each $x_i \in X$, computing $\Theta_i'$ according to FIG. 5 and the formula (14) and arranging the resulted $\Theta_i'$, i=1, . . . , t to be a general diagonal matrix;

Step 5: if $\Xi_X$ is invertible, left multiplying the general diagonal matrix resulted from Step 4 with $\Xi_X^{-1}$ to get the repair matrix $R_X$ according to the formula (18).

As shown in FIG. 1, Step 2 plus Step 3 can be performed either before or after Step 4.

The method of concurrent recovery for multiple data blocks stored distributedly will be explained in detail for centralized and distributed modes of data recovery.

Figure 6:
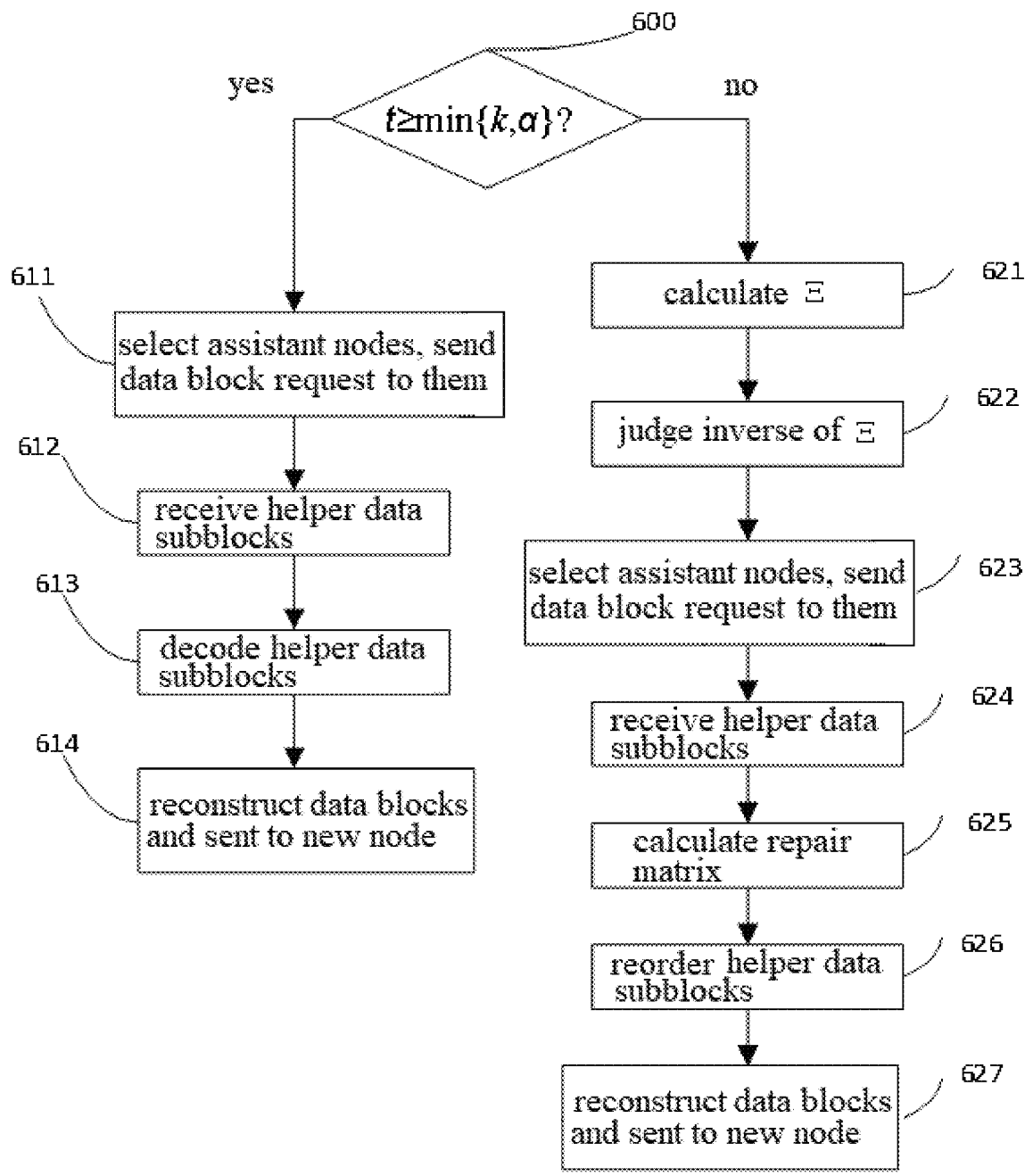
FIG. 6 is a flowchart schematically shown data recovery in a centralized recovery mode.

The concurrent recovery scheme for PM MSR regenerating codes that can jointly regenerate data blocks in the centralized mode is presented in FIG. 6, and the detailed explanation on each step will be described as follows. Since the recovery is centralized, besides providing helper data, all the other operations are performed on a central agent. After data recovery, the central agent is further needed to send the reconstruct data to corresponding new nodes. The missing data is unrecoverable when t>m. Therefore the situation of t>m is not covered herein for brevity. As shown in FIG. 6, at step 600, determining if t≥min{k, α} is true.

(1) if t≥min{k,α}:

Step 611: selecting k nodes as the assistant nodes randomly from the surviving nodes, sending a request to the assistant nodes by the central agent for asking the assistant nodes to offer their stored data blocks to the central agent;

Step 612: the central agent waiting until receiving all the k×α helper data sub-blocks;

Step 613: the central agent decoding the received data sub-blocks to get the source data; and Step 614: the central agent reconstructing the missing data blocks through encoding the source data and sending the reconstructed database to t new nodes.

(2) if t<min{k,α}:

Step 621: computing $\Xi_X$ according to Step 102 to Step 104 in FIG. 1;

Step 622: going to one of the following three operations a) to c) when $\Xi_X$ is not invertible, otherwise performing next step;

a) returning to Step 611 and reconstructing data by decoding;

b) adding a node to X and recalculating $\Xi_X$, then going to Step 623 when it is invertible or else performing a), b) or c);

c) replacing a node in X with another node outside X and calculating $\Xi_X$ again, then going to Step 623 when it is invertible or else performing a), b) or c);

Given that the number of entries in X is z. When all possible combinations of z<min{k,α} in performing b) and/or c) have been gone through, it is need to perform the operation a).

Step 623: selecting d−t+1 nodes from the surviving nodes as the assistant nodes according to step 101 in FIG. 1, the central agent sending a request to the assistant nodes to inform each of them to calculate according to the formula (10) and offer t helper data sub-blocks;

Step 624: the central agent waiting until receiving all t(d−t+1) helper data sub-blocks;

Step 625: computing repair matrix $R_X$ according to step 106 in FIG. 1;

Step 626: rearranging the received helper data sub-blocks according to the formula (16) so that it is corresponded to the general diagonal matrix in the formula (18); and Step 627: regenerating the missing data blocks by left multiplying the vector composed of the helper data sub-blocks re-ordered in step 626 with the repair matrix $R_X$ as shown in step 107 in FIG. 1, and sending the regenerated data to t new nodes.

For distributed recovery mode, each new node only needs to regenerate the data blocks stored in the failed node it substitutes. If t≤n−d, a new node can choose d surviving nodes as the assistant nodes and regenerate its own missing data blocks by obtaining one coded helper data sub-block from one corresponding assistant node, thus the recovery bandwidth is td sub-blocks. If t>n−d, it is impossible to only regenerate its missing data block for a single new node because there are not enough assistant nodes; in this situation, each new node has to regenerate at least t−(n−d)+1 missing data blocks concurrently with the aid of n−t assistant nodes.

The concurrent failure recovery scheme for PM MSR regenerating codes that can jointly regenerate missing data blocks in the distributed mode is presented in FIG. 7, and each detailed operation thereof is as follows. Besides providing helper data, other operations are performed on the new node(s).

Figure 7:
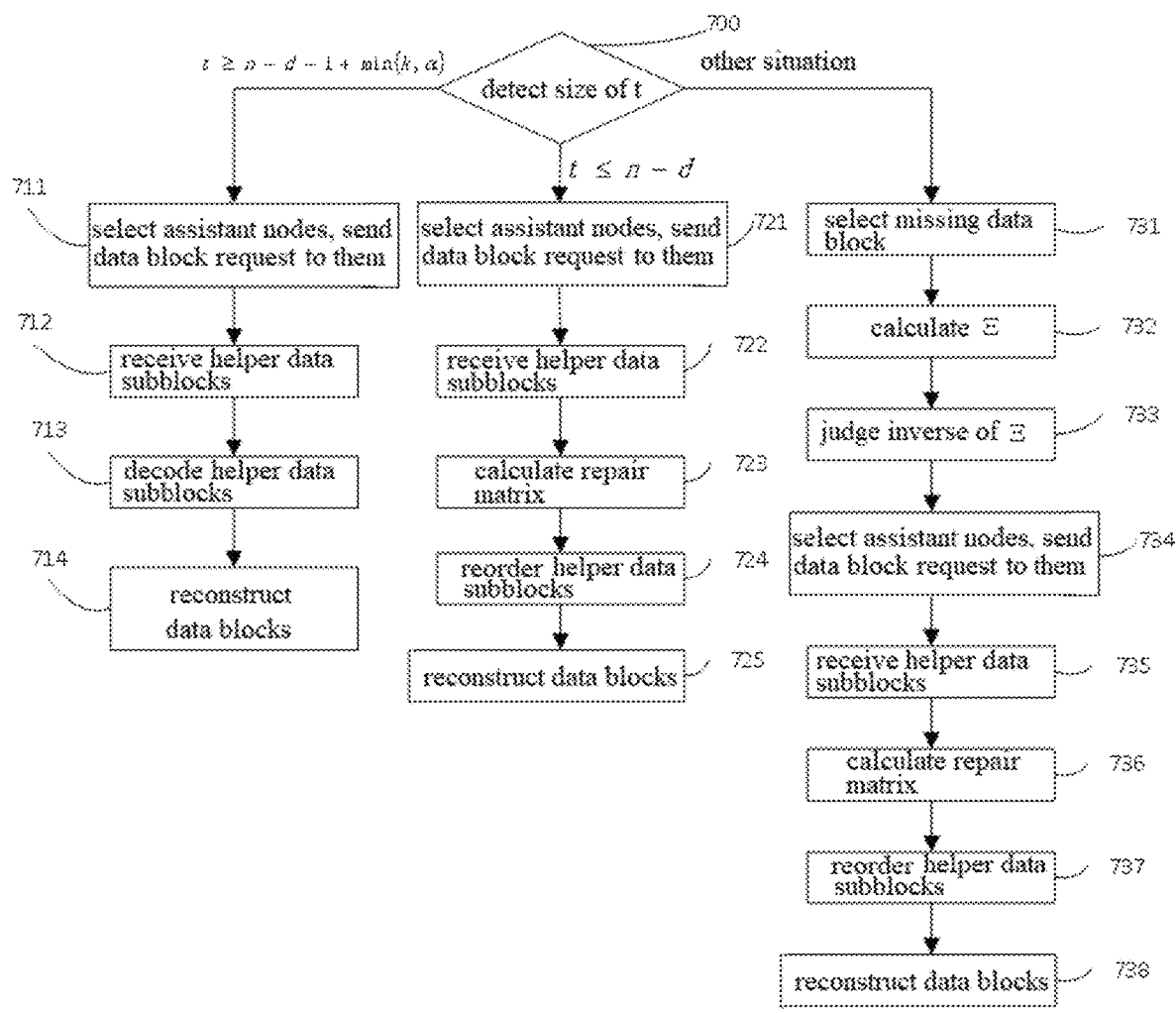
FIG. 7 is a flowchart schematically shown data recovery in a distributed recovery mode.

As shown in FIG. 7, at step 700, checking the size of t.

(1) if t≥n−d−1+min{k,α}:

Step 711: selecting k surviving nodes as the assistant nodes, the new node sending a request to the assistant node to inform them to offer their storing data blocks to the new node;

Step 712: the new node waiting until receiving all k×α data sub-blocks;

Step 713: decoding the received helper data sub-blocks to obtain source data; and Step 714: regenerating the missing data blocks through encoding, and returning.

(2) If t≤n−d:

Step 721: selecting d surviving nodes as the assistant nodes, the new node sending a request to the assistant nodes to inform the assistant nodes to calculate according to the formula (10) respectively and offer one helper data sub-block;

Step 722: the new node waiting until receiving all d helper data sub-blocks;

Step 723: computing repair matrix $R_{\{x_i\}}$ according to Step 106 shown in FIG. 16 where $x_i$ is the index of corresponding substitute node;

Step 724: re-arranging the received helper data sub-blocks according to formula (16) so that it is corresponded to the general diagonal matrix in the formula (18); and Step 725: regenerating the missing data blocks by left multiplying the vectors formed by the re-arranged helper data sub-blocks in Step 724 with the repair matrix $R_{\{x_i\}}$, and going back.

(3) other situation:

Step 731: selecting another u=t−n+d missing data blocks $c_{y_1}, c_{y_2}, \ldots, c_{y_u}$, letting x={$x_i, y_1, \ldots, y_u$}, where $x_i$ is the index of corresponding substitute node;

Step 732: calculating $\Xi_X$ according to the steps shown in FIG. 1;

Step 733: going to one of the following three operations a) to c) when $\Xi_X$ is not invertible, otherwise performing next step;

a) returning to step 1.1 and reconstructing data by decoding;

b) adding a node to X and recalculating $\Xi_X$, then going to step 734 when $\Xi_X$ is invertible or else performing a), b) or c);

c) replacing a node in X with another node outside X, recalculating $\Xi_X$ and going to Step 734 when it is invertible or else performing a), b) or c);

Given that the number of entries in X is z. When all possible combinations of z<min{k,α} in performing b) and/or c) have been gone through, it is needed to perform the operation a).

Step 734: selecting n−t surviving nodes as the assistant nodes, the new node sending assistant node sending a request to the assistant nodes to inform each assistant node to calculate according to the formula (10) and offer u+1 helper data sub-blocks;

Step 735: the new node waiting until receiving all the (n−t)(u+1) helper data sub-blocks;

Step 736: calculating the repair matrix $R_X$ according to the step 106 in FIG. 1;

Step 737: re-arranging the received helper data sub-blocks according to the formula (16) so that it is corresponded to the general diagonal matrix in the formula (18); and Step 738: regenerating the missing data blocks by left multiplying the vectors formed by the re-arranged helper data sub-blocks in Step 737 with the repair matrix $R_X$, and going back.

Note that when applying the above-mentioned algorithm, if t>n−d, a new node may not only reconstruct the data blocks stored on the failed node that it substitutes, but may also reconstruct the data blocks required by other substitute nodes at the same time. At this time, the substitute node can choose to send the additional reconstructed data blocks to other substitute nodes that are needed, so as to prevent these substitute nodes from rebuilding the data blocks by themselves. This can further reduce the recovery bandwidth and computing overhead, but requires the coordination and cooperation between nodes, and may increase the repair time, which belongs to the range of collaborative repair. In practical applications, trade-offs should be made based on system performance needs.

The principle and implementation manners present disclosure has been described above with reference to specific embodiments, which are merely provided for the purpose of understanding the present disclosure and are not intended to limit the present disclosure. It will be possible for those skilled in the art to make variations based on the principle of the present disclosure.

The invention claimed is:

1. A method of data recovery for a distributed storage system having totally n storage nodes each configured to store data, the system coding data to be stored with minimum storage regenerating code via product matrix construction C(n',k',d'), where n'=n+δ, k'=k+δ, d'=d+δ, δ denotes number of virtual nodes which are not real storage nodes, but theoretical storage nodes for computation, k indicates that data is equally divided into k segments, each segment contains a data sub-blocks, d is repair degree, C is resulted n'×α coded matrix and each entry thereof is data sub-block after encoded, first δ rows of C are zero, rows δ+1 to δ+k are source data and last m=n'−k' rows are coded parity data, such that only n=n'−δ data blocks of resulted n' coded data blocks are needed to be stored, the method comprising following steps:

Step 1: selecting assistant nodes from surviving nodes, wherein the surviving nodes are non-failed storage nodes, and the assistant nodes are storage nodes, selected from the surviving nodes, which provide helper data for data recovery, calculating helper data sub-blocks by using the assistant nodes, and sending the helper data sub-blocks to a regenerating node which is a storage node for reconstructing missing data of multiple failed storage nodes;

letting $\{N_i | 1 \le i \le n'\}$ denote a set of both virtual nodes and real nodes, the real nodes being real storage nodes, where $N_1 \sim N_\delta$ are virtual nodes and $N_{\delta+1} \sim N_{n'}$ are real nodes, number of the surviving nodes is n'−t, t is number of failed nodes which are the storage nodes missing the data and t≥1, defining $X=\{x_i | i=1, \ldots, t, \delta < x_i \le n'\}$ as a loss list, letting $c_{x_1}, c_{x_2}, \ldots, c_{x_t}$ denote missing data blocks, selecting d'−t+1 surviving nodes as assistant nodes, a set of the assistant nodes being denoted by $N_a = \{N_{a_i} | 1 \le i \le d'-t+1, 1 \le a_i \le n', a_i \notin X\}$, both the assistant nodes and the failed nodes being referred to as "evolved nodes" represented by $N_e = \{N_j | N_j \in N_a \text{ or } j \in X\}$, the assistant nodes $N_j \in N_a$ each first calculating inner products between its stored data block $c_j$ and $\{\phi_{x_i} | i=1, \ldots, t\}$, resulting in t helper data sub-blocks: $\{h_{x_i, j} = c_j \phi_{x_i}^T | i=1, \ldots, t\}$, then sending the helper data sub-blocks as helper data to the regenerating node, Step 2: the regenerating node calculating a repair matrix $R_X$:

(1) for each $x_i, x_j \in X, j \ne i$, calculating a matrix according to following formula:

$$\Omega_{i,j} = \theta_{x_i, f_j^i} \phi_{x_i}$$

where $\theta_{x_i, f_j^i} = \overline{\psi_{x_i, f_j^i}^{-1}} + \lambda_{x_i} \underline{\psi_{x_i, f_j^i}^{-1}}$, $\overline{\psi_{x_i, f_j^i}^{-1}}$ is a vector consisting of upper α entries of $\psi_{x_i, f_j^i}^{-1}$, and $\underline{\psi_{x_i, f_j^i}^{-1}}$ is lower α entries of $\psi_{x_i, f_j^i}^{-1}$, here $\psi_{x_i, f_j^i}^{-1}$ denotes columns of matrix $\Psi_{x_i}^{-1}$ that correspond to the helper data sub-blocks $h_{x_i, x_j} = c_{x_j} \phi_{x_i}^T$, $\Psi_{x_i}^{-1}$ is an inverse matrix of $\Psi_{x_i} = [\psi_j^T | N_j \in N_e, j \ne x_i]^T$, (2) letting $X_i = X | x_i$ to be an ordered set of remaining indices of the loss list X without $x_i$, and $G_i = \{g_j^i | j \ne i\}$ to be an ordered set of indices of columns in $\Psi_{x_i}^{-1}$ that correspond to data blocks $\{c_{x_j} | x_j \in X_i\}$, for each i=1~t:

$$\Theta_i = [\theta_{x_i, m} | 1 \le m \le d', m \notin G_i]$$

where computation of $\theta_{x_i, m}$ is identical to that of $\theta_{x_i, f_j^i}$, m=n−k, according to aforesaid computing process, there being $$\begin{bmatrix} I & \Omega_{1,2} & \cdots & \Omega_{1,t} \\ \Omega_{2,1} & I & \cdots & \Omega_{2,t} \\ \vdots & \cdots & \ddots & \vdots \\ \Omega_{t,1} & \Omega_{t,2} & \cdots & I \end{bmatrix} \begin{bmatrix} c_{x_1} \\ c_{x_2} \\ \vdots \\ c_{x_t} \end{bmatrix} = \begin{bmatrix} \Theta_1 \vec{h}_{x_1} \\ \Theta_2 \vec{h}_{x_2} \\ \vdots \\ \Theta_t \vec{h}_{x_t} \end{bmatrix}$$

where $\vec{h}_{x_i} = [h_{x_i, j} = c_j \phi_{x_i}^T | j \in N_a]^T$, (3) for each $x_i$, size of vector $\vec{h}_{x_i}$ is d'−t+1, actually first δ entries of $\vec{h}_{x_i}$ being all zero, accordingly first δ columns of each $\Theta_i$ being not useful at all, thereby replacing $\Theta_i \vec{h}_{x_i}$ with $\Theta'_i \vec{h}'_{x_i}$, where $\Theta'_i$ is $\Theta_i$ without first δ columns and $\vec{h}'_{x_i}$ is $\vec{h}_{x_i}$ without first δ entries:

letting $$\Xi_X = \begin{bmatrix} I & \Omega_{1,2} & \cdots & \Omega_{1,t} \\ \Omega_{2,1} & I & \cdots & \Omega_{2,t} \\ \vdots & \cdots & \ddots & \vdots \\ \Omega_{t,1} & \Omega_{t,2} & \cdots & I \end{bmatrix}$$

then repair matrix being:

$$R_X = \begin{bmatrix} I & \Omega_{1,2} & \cdots & \Omega_{1,t} \\ \Omega_{2,1} & I & \cdots & \Omega_{2,t} \\ \vdots & \cdots & \ddots & \vdots \\ \Omega_{t,1} & \Omega_{t,2} & \cdots & I \end{bmatrix}^{-1} \begin{bmatrix} \Theta'_1 & & & \\ & \Theta'_2 & & \\ & & \ddots & \\ & & & \Theta'_t \end{bmatrix}$$

and

Step 3: the regenerating node reconstructing missing data blocks for the multiple failed storage nodes:

obtaining missing data blocks by left multiplying vector $[\vec{h}'_{x_1}{}^T, \vec{h}'_{x_2}{}^T, \ldots, \vec{h}'_{x_t}{}^T]^T$ composed of the helper data sub-blocks with repair matrix $R_X$; and performing concurrent recovery of the multiple failed nodes by writing the reconstituted data blocks into new replacements for the failed nodes.

2. The method according to claim 1, wherein the repair matrix works for t<min{k, α}, and decoding is used for recovery missing data for t≥min{k, α}:

choosing k nodes as assistant nodes randomly from surviving nodes, downloading k×α from the assistant nodes, then decoding the data sub-blocks to obtain source data.

3. The method according to claim 1, wherein $\Xi_X$ is an inverse matrix, or $\Xi_X$ becomes invertible by adding a node to the loss list, or $\Xi_X$ becomes invertible by replacing one or some nodes in the loss list with other nodes; otherwise decoding to reconstruct missing data.

4. The method according to claim 1, wherein the method includes centralized data recovery, under which number of the assistant nodes is chosen according to number of the failed nodes to be recovered and collection of the helper data sub-blocks, computation of the repair matrix and reconstruction of the missing data are implemented by a central agent.

5. The method according to claim 1, wherein the method includes distributed data recovery, under which number of the assistant nodes is chosen according to number of the failed nodes to be recovered, each new node reconstructs data blocks stored on the failed node that it substitutes, and collection of the helper data sub-blocks, computation of the repair matrix and reconstruction of the missing data are implemented by each corresponding new node.

6. The method according to claim 5, wherein data blocks reconstructed by the new node further comprises data blocks needed by other new nodes.

* * * * *